United States Patent
Wang

(10) Patent No.: US 8,154,044 B2
(45) Date of Patent: Apr. 10, 2012

(54) LIGHT EMITTING DIODE PACKAGE STRUCTURE AND METHOD FOR FABRICATING THE SAME

(75) Inventor: Wen Huang Wang, Taipei County (TW)

(73) Assignee: Everlight Electronics Co., Ltd., Taipei (TW)

(*) Notice: Subject to any disclaimer, the term of this patent is extended or adjusted under 35 U.S.C. 154(b) by 210 days.

(21) Appl. No.: 12/688,695

(22) Filed: Jan. 15, 2010

(65) Prior Publication Data
US 2010/0176417 A1 Jul. 15, 2010

(30) Foreign Application Priority Data
Jan. 15, 2009 (TW) .............................. 98101338 A

(51) Int. Cl.
*H01L 33/00* (2010.01)
*H01L 21/56* (2006.01)

(52) U.S. Cl. .................. 257/99; 438/26; 257/E33.056

(58) Field of Classification Search ............ 257/98–100, 257/692, 693, 696, E33.056; 438/22, 25, 438/26, 27, 29
See application file for complete search history.

(56) References Cited

U.S. PATENT DOCUMENTS

| 7,208,772 B2 * | 4/2007 | Lee et al. .................. 257/99 |
| 2008/0023711 A1 | 1/2008 | Tarsa et al. |
| 2008/0067502 A1 | 3/2008 | Chakrapani et al. |

FOREIGN PATENT DOCUMENTS

| CN | 1917244 A | 2/2007 |
| WO | WO 03/001612 A1 | 1/2003 |

* cited by examiner

*Primary Examiner* — Evan Pert
*Assistant Examiner* — Selim Ahmed

(57) ABSTRACT

A light emitting diode and method for fabricating the same are provided. The light emitting diode comprises a lead frame. A first material body is formed on the lead frame, wherein the first material body comprises a tip, an inner surface and an outer surface. A second material body is formed on the lead frame to completely cover the outer surface of the first material body. Particularly, the first material body comprises hydrophilic polymer and the second material body comprises hydrophobic polymer.

16 Claims, 4 Drawing Sheets

LIGHT EMITTING DIODE PACKAGE STRUCTURE AND METHOD FOR FABRICATING THE SAME

CROSS REFERENCE TO RELATED APPLICATIONS

This application is based upon and claims the benefit of priority from the prior Taiwan Patent Application No. 98101338, filed on Jan. 15, 2009, the entire contents of which are incorporated herein by reference.

BACKGROUND OF THE INVENTION

1. Field of the Invention

The invention relates to a light emitting diode, and more particularly related to a light emitting diode package structure.

2. Description of the Related Art

Light emitting diodes (LEDs) have many advantages including high brightness, low volume, low power consumption and long life and they are used in a variety of display products. The lighting principle of LED is caused by a combination of electrons and holes in an LED when a voltage is applied to the LED. The combination releases photons from the diode.

In general, referring to FIG. 1a, the conventional light emitting diode package structure comprises a lead frame 10 and a molding plastic body 12. Next, a chip 14 is disposed on the lead frame 10, and a wire 16 is used to achieve an electrical connection. Finally, a transparent package resin 18 is filled to cover the chip 14 and the wire 16, thus the conventional light emitting diode package structure is obtained, as shown in FIG. 1b. In order to improve the adhesion ability of the plastic body 12 to the package resin 18, generally hydrophilic polymers are used for the plastic body 12. However, due to the hydrophilic property of the plastic body 12, the package resin may spill out to form overflowing residues 20 over the outer surface due to intermolecular interaction, as shown in FIG. 1c. Furthermore, since the plastic body 12 is completely constituted by hydrophilic polymer, peeling of the package resin from the plastic body 12 can be observed due to moisture absorption as exposed in the atmosphere for a relative duration of use.

Therefore, it is desirable to introduce a novel light emitting diode package structure that improves the aforementioned problems.

BRIEF SUMMARY OF THE INVENTION

An exemplary embodiment of a light emitting diode package structure includes a lead frame having a carrier portion. The lead frame has a carrier portion and a first material body formed on the lead frame exposes the carrier portion, wherein the first material body comprises an inner surface. A second material body is formed over the first material body to expose the inner surface of the first material body and the carrier portion of the lead frame. An LED chip is disposed on the carrier portion of the lead frame and then a package sealant is formed to cover the chip and the inner surface of the first material body, wherein the materials of the first material body and the package sealant are one of hydrophobic material and hydrophilic material, and the material of the second material body is another one of hydrophobic material and hydrophilic material.

An exemplary embodiment of a method for fabricating a light emitting diode package structure, includes providing a lead frame having a carrier portion; forming a first material body on the lead frame to expose the carrier portion, wherein the first material body comprises an inner surface; forming a second material body over the first material body to expose the inner surface of the first material body and the carrier portion of the lead frame; disposing an LED chip on the carrier portion of the lead frame; and forming a package sealant covering the chip and the inner surface of the first material body, wherein the materials of the first material body and the package sealant are one of hydrophobic material and hydrophilic material, and the material of the second material body is another one of hydrophobic material and hydrophilic material.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The embodiments of the invention disclose a light emitting diode package structure and method for fabricating the same, preventing overflowing residue and peeling off and further improving the reliability and stability of the light emitting diode package.

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
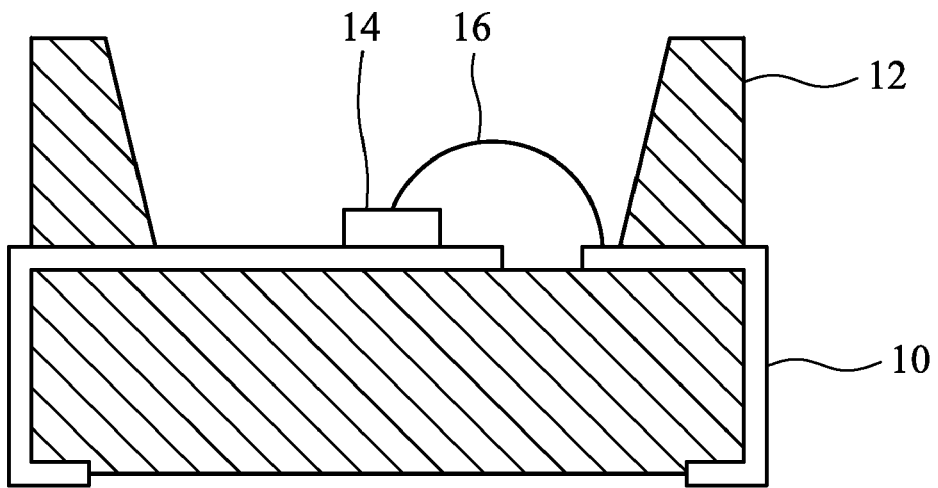
FIGS. 1a-1b illustrate the cross sections of a conventional light emitting diode package structure.
Figure 1B:
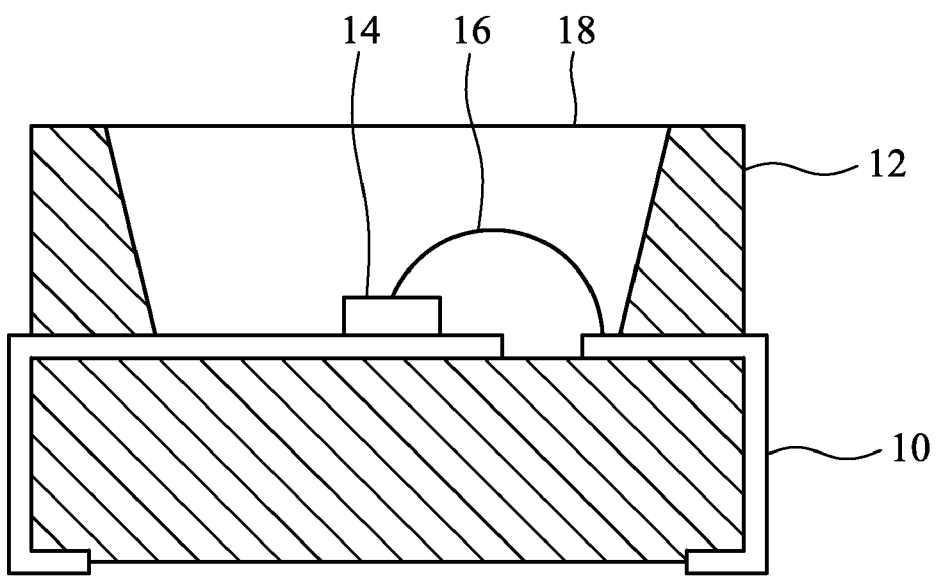
Figure 1C:
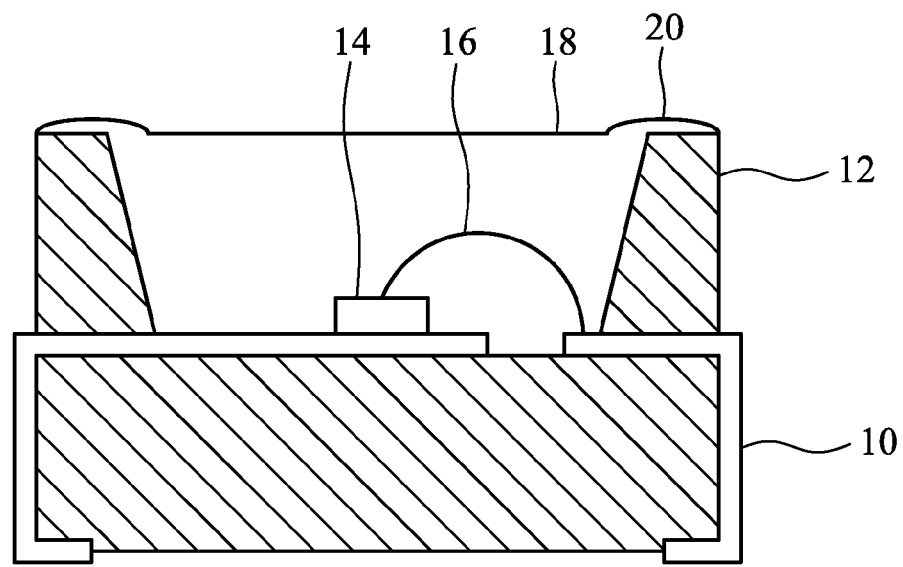
FIG. 1c illustrates the overflowing residue of the conventional light emitting diode package structure shown in FIGS. 1a and 1b.
Figure 2A:
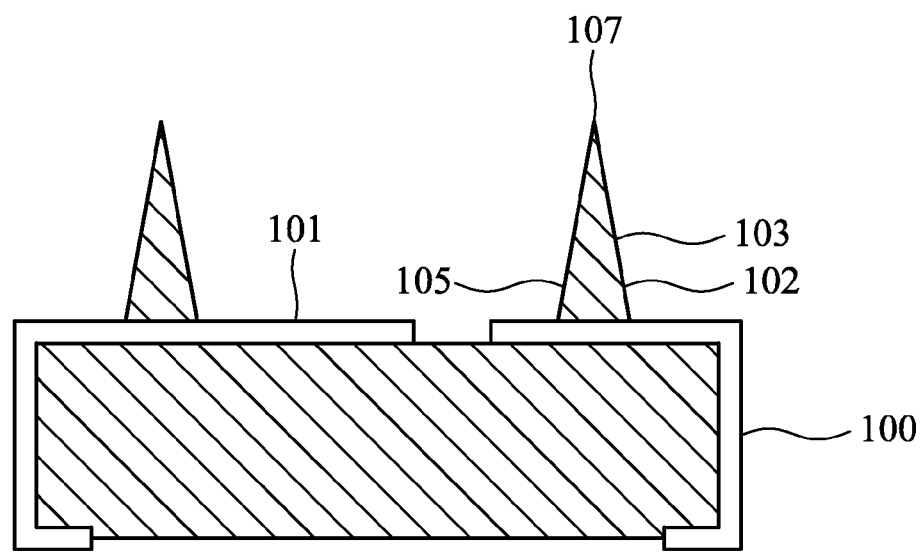
FIGS. 2a-2c illustrate the cross sections of a light emitting diode package structure in the fabricating process according to an embodiment of the invention.

First, referring to FIG. 2a, a lead frame 100 is provided, wherein the lead frame 100 has a carrier portion 101 for supporting a light emitting diode chip. The material and shape of the lead frame 100 are not limited and can be any material and shape disclosed in the prior art. Herein, the accompanying drawings show the lead frame 100 in a simple form in order to simplify the illustration.

Figure 3:
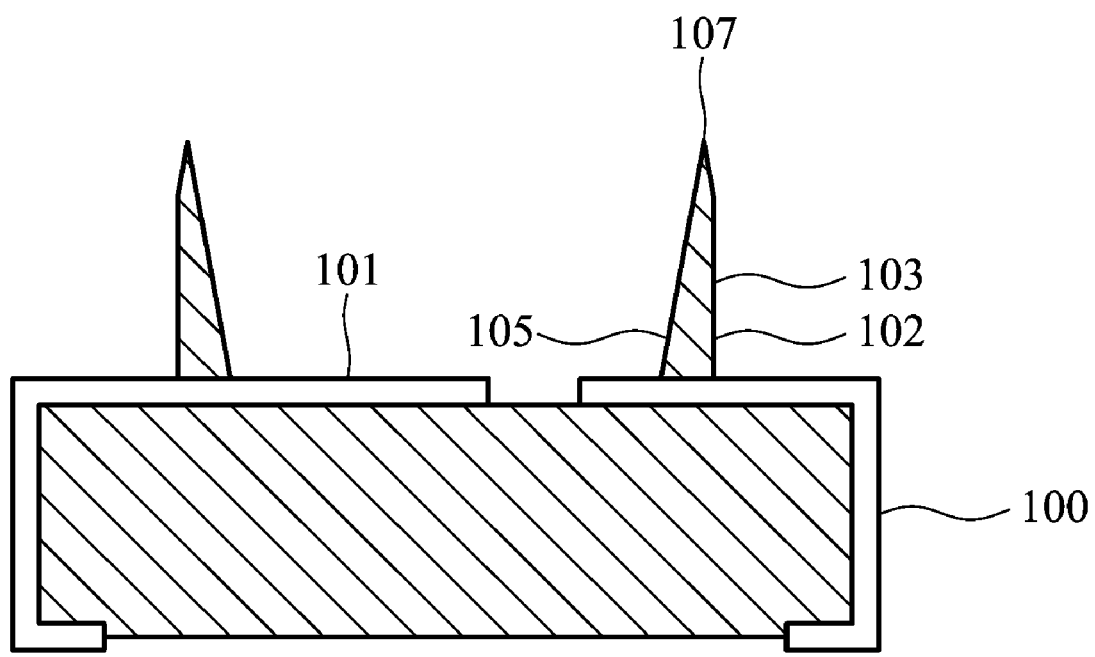
FIG. 3 illustrates the cross section of a light emitting diode package structure according to another embodiment of the invention.

Next, still referring to FIG. 2a, a first molding body 102 is formed on the lead frame 100 by injection with plastic material, wherein the first molding body 102 substantially surrounds the carrier portion 101. It should be noted that the first molding body 102 is located on the top surface of the lead frame 100 and substantially comprises a hollow collar member. A cavity is defined by the lead frame 100 and the first molding body 102, and the carrier portion 101 is located within the cavity. Referring to FIG. 2a, the first molding body 102 can have a tapered cross-section and comprises a tip 107, an inner surface 105 and an outer surface 103. The inner surface 105 or the outer surface 103 can be continuously smooth surfaces, or they can be discontinuous surfaces, as shown in FIG. 3.

According to an embodiment of the invention, the first molding body can be hydrophilic polymer. Therefore, the adhesion ability between the first molding body and a subsequently formed package sealant can be enhanced. The first molding body, for example, can be the material including, for example but not limited to, hydrophilic polyphthalamide, hydrophilic poly vinyl alcohol, hydrophilic poly vinyl pyrrolidone, hydrophilic polyamides or combinations thereof.

Figure 2B:
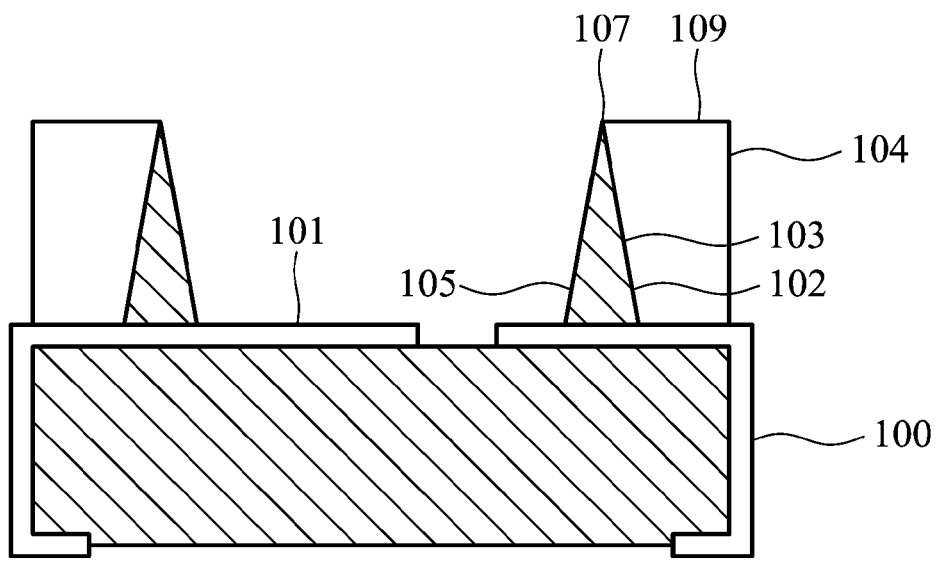

Next, referring to FIG. 2b, a second molding body 104 is formed on the lead frame 100 by injection with another plastic material. It should be noted that the second molding body 104 completely covers the outer surface 103 of the first molding body 102, and the top surface 109 of the second molding body 104 meets the outer surface 103 at the tip 107. One of key features of this invention is that the second molding body 104 preferably comprises hydrophobic polymer (not apt to absorb moisture). It will decrease the hygroscopic possibility for the molding body 104, for example, and the peeling defect can be prevented.

Furthermore, since the second molding body 104 completely covers the outer surface 103 of the first molding body 102, the subsequently formed package sealant is limited to merely contact the inner surface 105 of the first molding body. The hydrophilic outer surface 103 of the first molding body 102 is covered and isolated by the hydrophobic second molding body 104, and thus without the intermolecular hydrophilic interaction, the package sealant subsequently formed does not overflow to the outer surface of the light emitting diode package. The second molding body 104 can be the material including, for example but not limited to, polyester, polycarbonate, poly vinyl aromatic, polydioxanone or combinations thereof. Moreover, the second molding body 104 can comprise polymer blended with glass fiber.

Figure 2C:
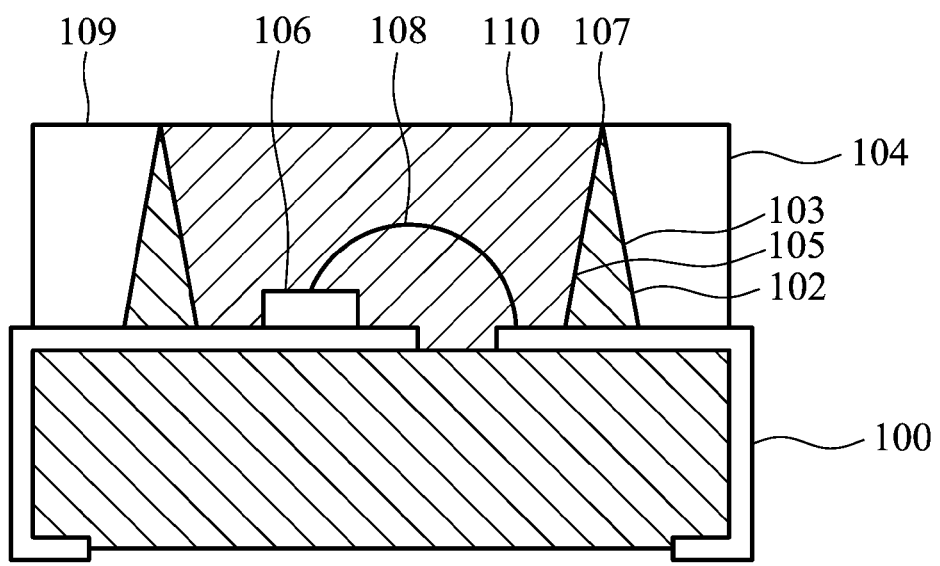

Finally, referring to FIG. 2c, after disposing a chip 106 on the carrier portion 101 and forming the electrical connection via a wire 108, a package sealant 110 is filled into the cavity to cover the chip 106, thus completing fabrication of the light emitting diode package structure of an embodiment of the invention. It should be noted that the package sealant 110 substantially covers the inner surface 105 of the first molding body 102. The chip 106 and package sealant 110 are not limited and can be in any matter disclosed in the prior art.

Accordingly, the light emitting diode package structure and method for fabricating the same provided by the invention can prevent the occurrence of overflowing residue and peeling of the package sealant from the plastic body including the first molding body and the second body. Since hygroscopic possibility of the plastic body can be reduced to 50% and the adhesion ability between the plastic body and the package sealant can be maintained, the reliability and stability of the light emitting diode package is improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode package structure, comprising:
   a lead frame having a carrier portion;
   a first material body formed on the lead frame to expose the carrier portion, wherein the first material body comprises an inner surface;
   a second material body formed over the first material body to expose the inner surface of the first material body and the carrier portion of the lead frame;
   an LED chip disposed on the carrier portion of the lead frame; and
   a package sealant covering the chip and the inner surface of the first material body, wherein the materials of the first material body and the package sealant are one of hydrophobic material and hydrophilic material, and the material of the second material body is another one of hydrophobic material and hydrophilic material.

2. The light emitting diode package structure as claimed in claim 1, wherein the inner surface is discontinuous.

3. The light emitting diode package structure as claimed in claim 1, wherein the inner surface is continuously smooth.

4. The light emitting diode package structure as claimed in claim 1, wherein the first material body comprises hydrophilic polymer.

5. The light emitting diode package structure as claimed in claim 4, wherein the first material body comprises hydrophilic polyphthalamide, hydrophilic poly vinyl alcohol, hydrophilic poly vinyl pyrrolidone, hydrophilic poly amides or combinations thereof.

6. The light emitting diode package structure as claimed in claim 1, wherein the second material body comprises hydrophobic polymer.

7. The light emitting diode package structure as claimed in claim 6, wherein the second material body comprises polyester, polycarbonate, poly vinyl aromatic, or polydioxanone.

8. The light emitting diode package structure as claimed in claim 7, wherein the second material body comprises polymer blended with glass fiber.

9. A method for fabricating a light emitting diode package structure, comprising:
   providing a lead frame having a carrier portion;
   forming a first material body on the lead frame to expose the carrier portion, wherein the first material body comprises an inner surface;
   forming a second material body over the first material body to expose the inner surface of the first material body and the carrier portion of the lead frame;
   disposing an LED chip on the carrier portion of the lead frame; and
   forming a package sealant covering the chip and the inner surface of the first material body, wherein the materials of the first material body and the package sealant are one of hydrophobic material and hydrophilic material, and the material of the second material body is another one of hydrophobic material and hydrophilic material.

10. The method as claimed in claim 9, wherein the inner surface is discontinuous.

11. The method as claimed in claim 9, wherein the inner surface is continuously smooth.

12. The method as claimed in claim 9, wherein the first material body comprises hydrophilic polymer.

13. The method as claimed in claim 12, wherein the first material body comprises hydrophilic polyphthalamide, hydrophilic poly vinyl alcohol, hydrophilic poly vinyl pyrrolidone, hydrophilic poly amides or combinations thereof.

14. The method as claimed in claim 9, wherein the second material body comprises hydrophobic polymer.

15. The method as claimed in claim 14, wherein the second material body comprises polyester, polycarbonate, poly vinyl aromatic, polydioxanone or combinations thereof.

16. The method as claimed in claim 15, wherein the second material body comprises polymer blended with glass fiber.

* * * * *